United States Patent [19]

Briere

[11] Patent Number: 4,505,022
[45] Date of Patent: Mar. 19, 1985

[54] JUNCTION VERTICAL FIELD EFFECT TRANSISTOR AND PROCESS FOR THE PRODUCTION THEREOF

[75] Inventor: Pierre Briere, Paris, France

[73] Assignee: Thomson-CSF, Paris, France

[21] Appl. No.: 387,237

[22] Filed: Jun. 10, 1982

[30] Foreign Application Priority Data

Jun. 16, 1981 [FR] France ............................ 81 11838

[51] Int. Cl.³ ............................................ H01L 29/06
[52] U.S. Cl. .................................... 29/571; 29/578; 29/580; 148/1.5; 357/22; 357/55; 357/59; 156/654; 156/657
[58] Field of Search ............... 29/571, 578, 579, 580; 148/1.5; 357/22, 23, 55, 59; 156/654, 657, 658

[56] References Cited

U.S. PATENT DOCUMENTS

| 3,851,379 | 12/1974 | Gutknecht et al. | 357/23 X |
|---|---|---|---|
| 4,070,690 | 1/1978 | Wickstrom | 357/22 X |
| 4,129,879 | 12/1978 | Tantraporn et al. | 357/22 |
| 4,262,296 | 4/1981 | Sheely et al. | 357/55 |
| 4,337,115 | 6/1982 | Ikeda et al. | 156/657 X |

OTHER PUBLICATIONS

IEEE Transactions On Electron Devices, vol. ED-25, No. 3, Mar. 1978, New York, J. I. Nishizawa et al.: "High-Frequency High-Power Static Induction Transistor", pp. 314-322.
IEEE International Electron Devices Meeting, Technical Digest, Dec. 4-6, 1978, Washington (New York), J. Nishizawa et al.: "Bipolar Mode Static Induction Transistor (BSIT)-High Speed Switching Device," pp. 676-679.
IEEE Transactions On Electron Devices, vol. ED-25, No. 1, Jan. 1978 (New York), Oamu Ozawa et al.: "A Vertical FET with Self-Aligned Ion-Implanted Source and Gate Regions", pp. 56-57.
IEEE Transactions On Electron Devices, vol. ED-26, No. 4, Apr., 1979 (New York), T. Sakai et al.: "Elevated Electrode Integrated Circuits", pp. 379-385.
Solid State Electronics, vol. 21, No. 9, Sep. 1978, Pergamon Press Ltd., B. A. Boxall: "A Technique For Producing Polysilicon Patterns With Bevelled Edge Profiles Using Wet Etching", pp. 1173-1174.

Primary Examiner—Brian E. Hearn
Assistant Examiner—David A. Hey
Attorney, Agent, or Firm—Roland Plottel

[57] ABSTRACT

This transistor comprises a first main surface of alternating source and gate strips. A gate metallization rests on the gate strips and a source metallization rests on a polycrystalline silicon rail formed above the source strips. Such a device can be manufactured by entirely self-aligned methods and is applicable particularly to the very high frequency range up to a few dozen gigahertz.

3 Claims, 8 Drawing Figures

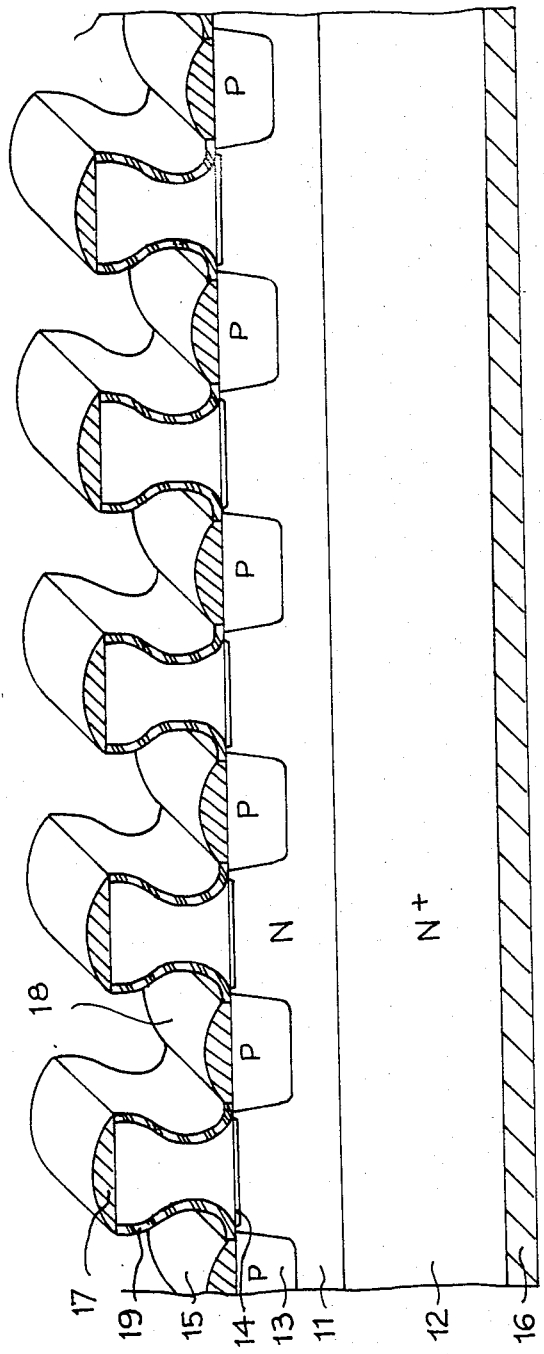
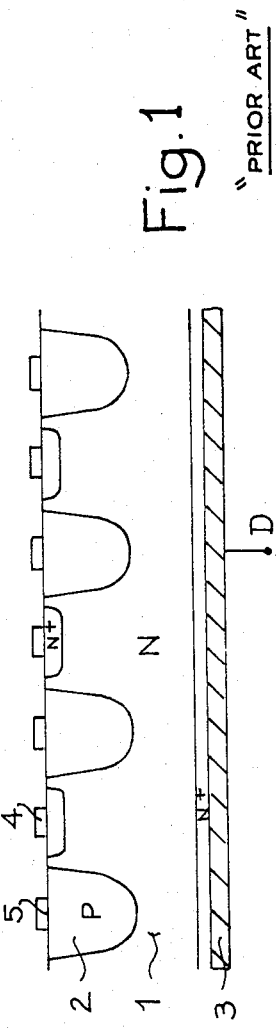

JUNCTION VERTICAL FIELD EFFECT TRANSISTOR AND PROCESS FOR THE PRODUCTION THEREOF

BACKGROUND OF THE INVENTION

The present invention relates to a junction vertical field effect transistor in which the source and grid electrodes are arranged in the form of alternating parallel fingers of very small width on a semiconductor substrate and the production process permitting a significant miniaturization thereof.

As far as is known to the Applicant, the first junction vertical field effect transistors were described in French Pat. No. 1,163,241 filed on Dec. 10th 1956 by Stanislas Teszner. FIG. 6 of this patent is represented in a slightly modified form as FIG. 1 of the present specification. It is possible to see therein a vertical field effect transistor comprising a type N silicon substrate in which, starting from a surface, are formed relatively deep type P diffused zones 2. A drain D electrode 3 is integral with the lower face, whilst source (S) electrodes 4 are integral with that part of the N substrate appearing on the upper face. Control or gate electrodes are integral with the visible part of the type P zones on the upper surface. Unmarked type N+ zones ensure the ohmic contact with the source and drain electrodes. If no voltage is applied to the gate electrodes, a current can pass between these source and drain electrodes if a potential difference is applied. If a suitable polarity voltage is applied to the gate electrodes, a space charge develops around the type P zones and closes the channels permitting the passage of a current from the source to the drain. On the basis of this first description of a vertical field effect transistor, numerous structures have been described for permitting the miniaturization of vertical field effect transistors.

BRIEF SUMMARY OF THE INVENTION

One object of the present invention is to provide a novel, particularly miniaturized structure and a process for the production of such a structure making it possible to use a single mask and thus obtain elementary pitches of dimensions which can be below 5 microns (e.g. 3 to 4 microns).

Another object of the invention is to permit the construction of a vertical field effect transistor with a very limited channel length.

In order to achieve these and other objects, the present invention relates to a junction vertical field effect transistor structure in which the source and gate electrodes are arranged in the form of alternating parallel fingers of very small width on a semiconductor substrate, each gate electrode being constituted by a metallization strip resting on an elongated area penetrating the substrate and having a different conductivity type to that of the substrate, wherein the source metallizations rest on a polycrystalline silicon rail of the same conductivity type as the substrate and having a cross-section in the form of a diabolo. (The meaning of the latter term will be explained hereinafter relative to the drawings).

For the production of such a transistor, the present invention provides the following steps: forming on a monocrystalline silicon substrate a polycrystalline silicon layer, whose median portion is highly doped in accordance with the conductivity type of the substrate and whose upper and lower portions are slightly doped; masking the polycrystalline silicon surface strips and etching the polycrystalline silicon using an agent which more rapidly etches the highly doped portion leading to the formation of polycrystalline silicon rails between which appears the surface of the substrate, said rails having a cross-section like that of a diabolo; performing an oxidizing heat treatment or a vapour phase dielectric deposition; implanting a doping agent of the opposite type to that of the substrate perpendicular to the main surface thereof; eliminating the implanted oxide layer and the layer used for masking the polycrystalline silicon strips; performing an annealing treatment; and sputtering a conductive substance perpendicular to the main surface of the substrate.

Among the applications of a device like that of the present invention are in particular those in very high frequency ranges between 1 megahertz and several gigahertz.

BRIEF DESCRIPTION OF THE DRAWINGS

The invention is described in greater detail hereinafter relative to preferred embodiments and with reference to the attached drawings, wherein show:

FIG. 1 a prior art vertical field effect transistor.

FIG. 2 a vertical field effect transistor according to the present invention.

DETAILED DESCRIPTION OF THE PREFERRED EMBODIMENTS

Figure 3:
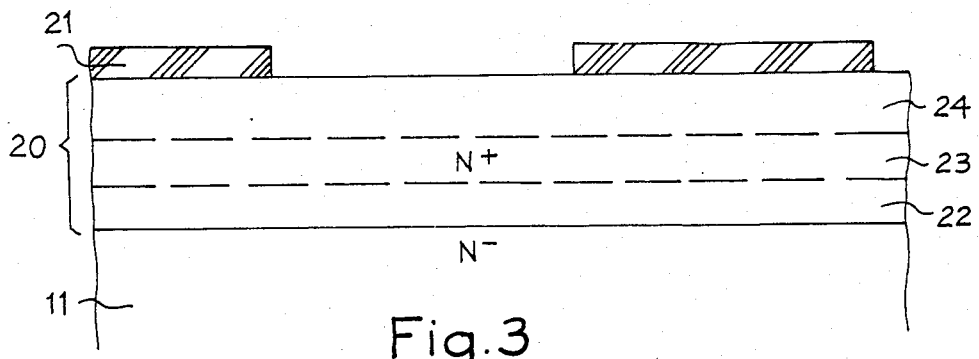
FIGS. 3–5 and 7 different stages in the production of a field effect transistor according to the invention, FIGS. 6a and 6b representing two possible variants.

As can be seen in FIG. 2, a vertical field effect transistor according to the invention comprises a weakly doped layer 11, e.g. of type N, on a stongly doped layer 12 of the same type, layer N being, for example, formed by epitaxy on a N+ substrate. Starting from the upper surface of layer N are formed strips 13 doped in accordance with the P conductivity type and strips 14 doped in accordance with N+ conductivity type, the diffusion depth being much less than that of strips 13. Strips 14 are surmounted by polycrystalline silicon rails 15 having essentially the shape shown in the drawing and essentially characterized by the fact that their upper and lower widths are greater than their median widths. To designate rails with such a shape hereinafter, it will be said that they have a cross-section in the form of a diabolo. A drain metallization 16 is integral with the lower N+ face, a source metallization 17 is integral with the upper face of the rails 15 and a metallization 18 is integral with the surface of the P type strips 13. The lateral faces of rails 15 are covered with an insulating layer 19, formed from silica in the present embodiment. As will be gathered from the detailed description of the process hereinafter, an advantage of this structure is that it can be produced by successive self-alignment methods, which obviates any problem of mask repositioning.

The N+ layer 14 having a very limited diffusion depth ensures a good ohmic contact between the polycrystalline silicon rail 15 and the type N layer 11 in order to ensure a satisfactory conductivity towards the source metallization 17.

FIGS. 3 to 7 relate to certain of the successive production steps of a device according to the invention. In a first step, on the basis of an upper type N layer 11, designated N− to stress that it has a low doping level, is formed a polycrystalline silicon layer 20 on which is formed a masking layer 21 in the form of close-together strips, e.g. a silica layer or a silicon nitride layer. The polycrystalline silicon layer 20 is broken down into three sublayers having different doping levels. Lower part 22 and upper part 24 are weakly doped or undoped and the median part 23 is strongly or highly doped. This is followed by chemical etching using a selective product, which more rapidly etches the highly doped polycrystalline silicon that the weakly doped polycrystalline silicon.

Figure 4:
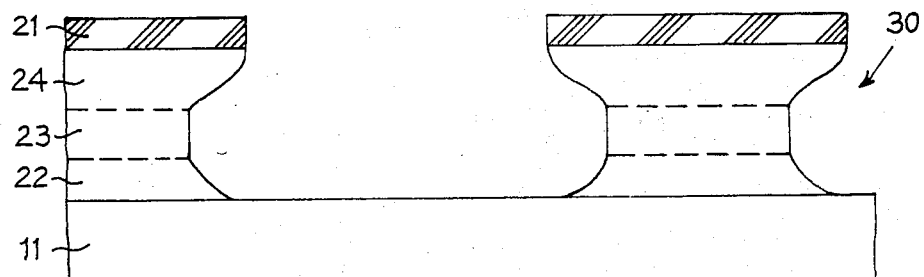

This leads, in the manner shown in FIG. 4, to parallel polycrystalline silicon rails 30 having a cross-section in the form of a diabolo, which is narrower at the points corresponding to the initial highly doped layer 23.

Figure 5:
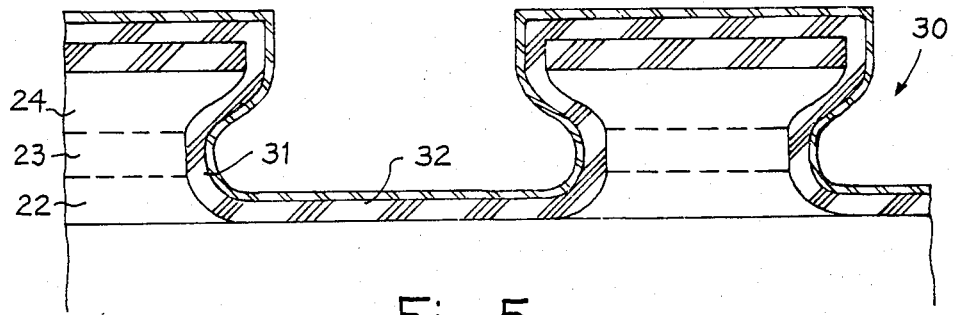

After this, and as illustrated in FIG. 5, there is a slight thermal oxidation or a vapour phase silica deposition and then a vapour phase silicon nitride deposition. This double protective layer is designated by reference numeral 31 on the walls of rails 30 and by reference numeral 32 at the points where the monocrystalline silicon surface 11 appears.

Figure 6A:
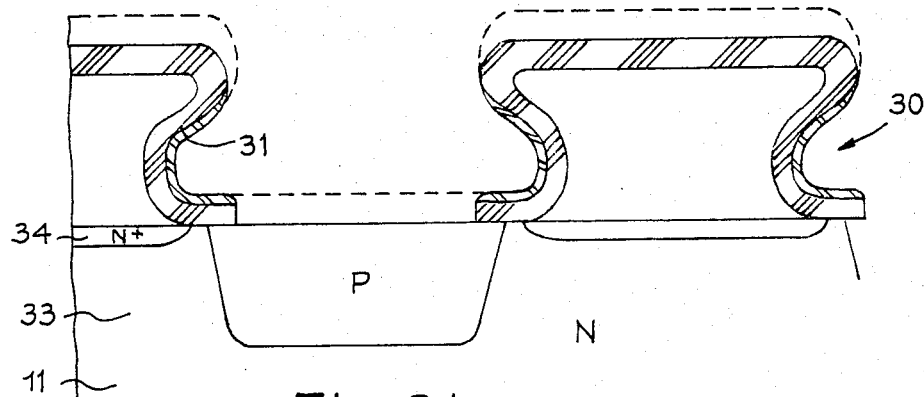

In the following step, illustrated in FIGS. 6a or 6b, the double layer 32 is removed, and a type P doping is carried out on the upper surface of the monocrystalline silicon layer 11 at the points not coated with polycrystalline silicon. The order of the steps can differ as a function of the chosen technologies. For example, it would be possible to start with ionic implantation traversing the double layer 32 and defined by the upper projecting edges of rails 30. Chemical etching would then be used to eliminate double layer 32, on the one hand by acting on the etching selectivity between the double layer 32 having undergone a type P implantation and double layer 31 which has not undergone implantation, in view of its lateral, set back character and on the other hand, with respect to the layer covering the upper surface of rails 30, by acting on the thickness differences. It would also be possible to at least partly remove the double layer 32 before carrying out a type P implantation or diffusion, e.g. by effective vertical implantation of a doping agent suitable for making the double layer 32 selectively etchable compared with the lateral double layer 31 and then by carrying out the diffusion or implantation of a type P doping agent.

Figure 6B:
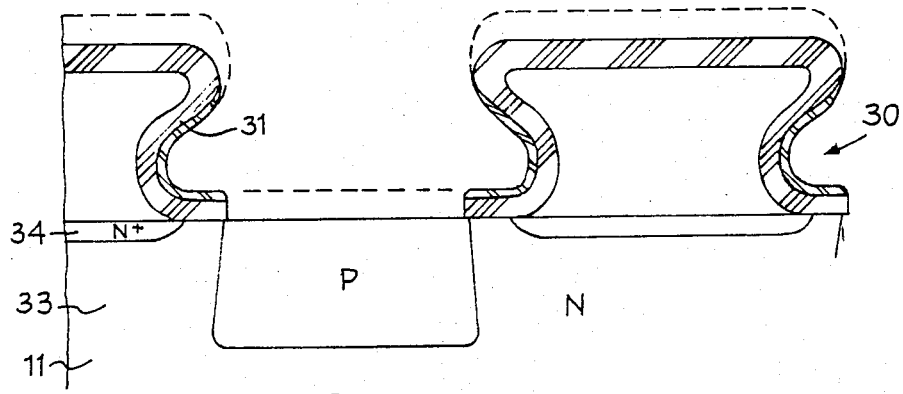

FIG. 6b illustrates a detail of the present invention, according to which it is desirable to carry out a very deep implantation of the type P doping agent and then a thermal annealing stage in such a way that the type P implanted area has, in cross-section, the illustrated configuration, i.e. its lateral extension at the surface of the monocrystalline silicon layer 11 is relatively small. To further increase this effect, it is possible, during the polycrystalline silicon etching stage illustrated in FIG. 4, to continue the etching to eliminate the surface portion of the monocrystalline silicon substrate, e.g. over a depth of 1000 to 2000 Å.

Simultaneously with the annealing of the implantation to supply the type P zones 33, there is a diffusion of the doping agent contained in the polycrystalline silicon of rails 30. Thus, the three zones 22, 23 and 24 disappear to form a single highly doped zone. Due to the fact that the highly doped zone 23 is separated from substrate 11 by a weakly doped layer 22, the N+ doping agent diffuses much less than the P doping agent into the monocrystalline silicon. Thus, the N+ overdoping zones are shallower than the type P zones 33. Preferably, the doping agents are chosen in such a way that this depth difference is increased.

Figure 7:
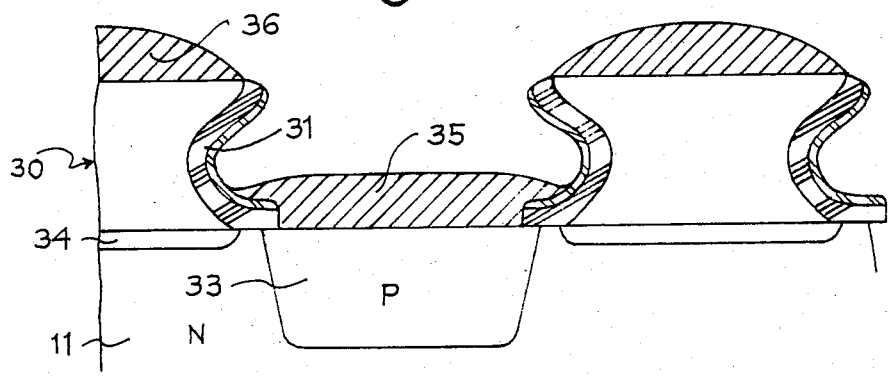

In a final step, whose result is illustrated in FIG. 7, layer 21 protecting the upper surface of the rails is eliminated. This is followed by metallization deposition, preferably by vaporization or sputtering from a point source in order to obtain gate metallization strips 35 and source metallization strips 36 at different levels. This automatic alignment is obtained as a result of the special shape of the rails 30 which prevents any continuity between metallizations 35 and 36.

The cross-sectional shape of rails 30 results from the doping levels of the sublayers 22, 23 and 24 forming the polycrystalline silicon layer 20. This polycrystalline silicon layer can be formed in several ways, namely by the deposition of an undoped polycrystalline silicon layer in which an N+ doping agent is implanted at a selected depth, or by the successive deposition of an undoped layer, a layer doped in situ and then an undoped surface layer.

The N+ diffusion 34 is shown as having a certain thickness. In actual fact, the N+ doping atoms must penetrate the monocrystalline silicon layer 11 to the minimum possible extent to prevent any lateral joining between the N+ diffusion 34 and the P diffusion 33.

In a practical embodiment, a structure according to the invention can be realised with a pitch of 4 microns by selecting a total thickness of the polycrystalline silicon layer 20 of approximately 5000 Å, with a silica thickness of approximately 1000 Å and a silicon nitride thickness of approximately 500 Å for double layer 31. The type N+ doping agent is preferably arsenic, which has a relatively slow diffusion rate, whilst the type P doping agent is appropriately boron in the case when diffusion is carried out, or boron or gallium in the case where layer P is obtained by implantation. The junction depth of the type P layer 33 is then approximately 3000 to 10,000 Å, whilst the depth of layer 34 is a few hundred Å.

The present invention is not limited to the embodiments specifically described hereinbefore. In fact, it covers numerous variants as described in the following claims. In particular, the conductivity type can be modified and the semiconductor substrate need not be of silicon.

What is claimed is:

1. A process for manufacturing on a silicon wafer a junction vertical field effect transistor having a source electrode and a gate electrode, said electrodes being shaped as parallel interdigitated fingers of very small width, said process comprising the following steps:

forming on a major surface of a monocrystalline substrate of a first type of conductivity a doped polycrystalline silicon layer of the same first type, said layer having a lower slightly doped portion, a median highly doped portion, and an upper slightly doped portion, forming on the polycrystalline layer a masking layer having a pattern of parallel fingers of very small width and spacing, etching the polycrystalline silicon where it is not masked until exposing the monocrystalline silicon substrate, using an etching agent which more rapidly etches highly doped silicon than slightly doped silicon, thus leaving on the substrate parallel fingers of polycrystalline silicon separated by exposed portions of monocrystalline silicon, said fingers having a rail-shaped cross-section with enlarged width in an upper and lower portions of their height, corresponding respectively to the said upper and lower portions of said polycrystalline layer, forming an insulating layer comprising silicon oxide and entirely covering the exposed monocrystalline silicon and the polycrystalline fingers, implanting an impurity of a second type of conductivity opposite to the first type perpendicularly to the said major surface of the substrate, on the whole of this surface, therefore doping the insulating layer except where it is protected against implantation by the upper portion of said fingers, removing the insulating layer where it has been implanted and removing the masking layer on the polycrystalline silicon fingers, performing an annealing treatment, sputtering a conductive substance perpendicularly to said major surface of the substrate so that this conductive substance is deposited only on said polycrystalline fingers and on said monocrystalline substrate between the fingers.

2. A process according to claim 1 wherein the insulating layer is a double layer formed from a layer of silicon oxide having a thickness of approximately 1000 Å and a layer of silicon nitride having a thickness of approximately 500 Å.

3. A process according to claim 1 wherein the layer of polycrystalline silicon has a thickness of approximately 4000 to 8000 Å and the insulating layer has a thickness of approximately 1000 Å.

* * * * *